SINGLE CRYSTAL MOLYBDENUM ON INSULATING SUBSTRATES

Filed Oct. 2, 1967

INVENTOR.
HAROLD M. MANASEVIT
BY
Howard A Silber
ATTORNEY

United States Patent Office 3,493,430
Patented Feb. 3, 1970

3,493,430

SINGLE CRYSTAL MOLYBDENUM ON INSULATING SUBSTRATES

Harold M. Manasevit, Anaheim, Calif., assignor to North American Rockwell Corporation Filed Oct. 2, 1967, Ser. No. 672,200
Int. Cl. C23c *13/02*
U.S. Cl. 117—227 8 Claims

ABSTRACT OF THE DISCLOSURE

A heteroepitaxial composite comprising a single crystal, electrically insulating, metal oxide substrate and a monocrystalline layer of molybdenum epitaxially disposed on the substrate. Applicable single crystal substrates include sapphire, magnesium oxide, beryllium oxide, and magnesium aluminate spinel. The inventive composite may be prepared by prolytic decomposition of molybdenum hexafluoride in a hydrogen atmosphere onto a substrate heated to a temperature of from 650° C. to 900° C. Epitaxy has been confirmed by X-ray Laue and three-circle goniometer studies.

BACKGROUND OF THE INVENTION

Field of the invention

The present invention relates to a heteroepitaxial composite of molybdenum on an insulating substrate. More particularly, the present invention relates to a heteropitaxial composite comprising a substrate of single crystal, electrically insulating, metal oxide and a single crystal film of molybdenum epitaxially disposed on the substrate.

Description of the prior art

In recent years the quest for materials useful for microelectronic and integrated circuit devices has indicated the need for a structure comprising a single crystal metal epitaxially disposed on a single crystal, electrically insulating substrate. Such composites would be useful, for example, as intermediates for multilayer heteroepitaxial composites useful as tunnel cathodes, Gunn effect devices, and the like. (See for example the application to Miller et al., Ser. No. 655,909, owned by North American Rockwell Corporation, owner of the present application). Such composites would be useful to provide electrical interconnections for integrated circuits, since additional single crystal semiconductor material could be deposited epitaxilly atop the interconnections. Such a structure would permit embedded conductors between active devices and would facilitate truely three-dimensional integrated circuits.

In the past, semiconductor materials have been epitaxially deposited on insulating substrates. For example, single crystal silicon has been deposited on sapphire, BeO, and various other substrates, as reported, e.g., in the application to Manasevit et al., Ser. No. 403,439, owned by North American Rockwell Corporation, owner of the present application. However, only one instance of single crystal metal (tungsten) deposition on an insulating substrate has been reported (see Miller et al., Journal of Applied Physics, 1966, vol. 37, pp. 21–29).

To date, epitaxial growth of molybdenum on insulating substrates has not been reported. While some patents have described vapor deposition of molybdenum, these typically have been directed to fabrication of non-single crystal resistors (see, e.g., U.S. Patent No. 2,885,310 to Olson, et al.) or to production thin metal films on glass fibers (see, e.g., U.S. Patent No. 2,979,424 to Whitehurst). Such prior art structures of course are not useful in multilayer integrated circuits.

The present invention sets forth a heteroepitaxial composite of molybdenum on various single crystal, electrically insulating, metal oxide substrates, useful as an intermediate in multilayer microelectronic integrated circuit structures.

SUMMARY OF THE INVENTION

The present invention comprises a heteroepitaxial composite comprising a substrate of single crystal, electrically insulating, oxide on which is provided an epitaxial layer of single crystal molybdenum. The substrate may comprise aluminum oxide, magnesium oxide, magnesium oxide, beryllium oxide, or magnesium aluminate spinel.

Preparation of the heteroepitaxial molybdenum film is by pyrolytic decomposition of molybdenum hexafluoride in a hydrogen atmosphere onto a substrate heated to a temperature between 650° C. and 900° C.

X-ray Laue analysis and full circle goniometer studies indicate the heteroepitaxial relationship between the molybdenum and the substrate, and define various orientations at which epitaxy occurs.

It is thus an object of the present invention to provide a heteroepitaxial structure comprising a single crystal, electrically insulating substrate and a single crystal film of molybdenum on the substrate.

Another object of the present invention is to provide a technique for making a heteroepitaxial composite comprising an electrically insulating, single crystal, oxide substrate and a film of monocrystalline molybdenum on said substrate.

Yet another object of the present invention is to provide a composite including a film of single crystal molybdenum on a monocrystalline substrate of sapphire, MgO, BeO, or magnesium aluminate spinel, which composite is useful as an intermediary in the production of multilayer heteroepitaxial integrated circuits.

These and other objects of the invention will become apparent the the following description taken in connection with the accompanying drawings.

DESCRIPTION OF THE PREFERRED EMBODIMENT

Figures 1, 3:
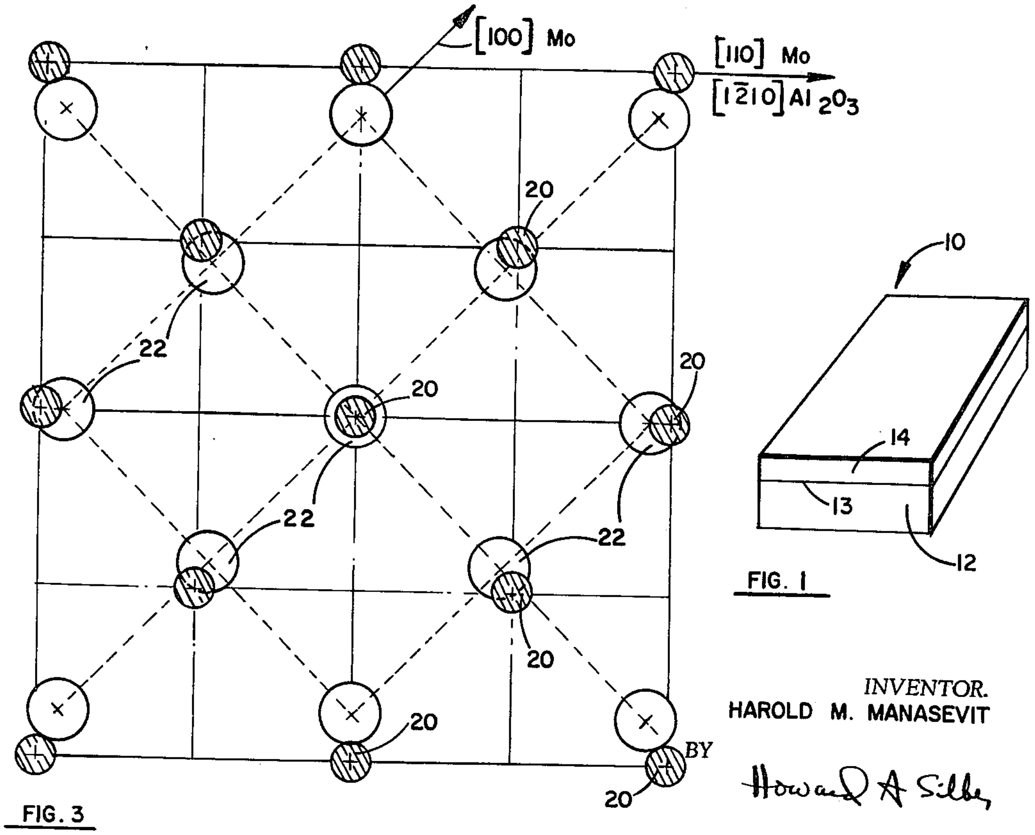
FIGURE 1 is a greatly enlarged perspective view of a heteroepitaxial composite of molybdenum on an electrically insulating substrate, in accordance with the present invention.
FIGURE 3 is a symbolic overlay diagram showing possible relative orientations at the interface between a sapphire ($Al_2O_3$) substrate and an epitaxial layer of Mo. As shown, the ($1\bar{1}02$) crystallographic plane of the $Al_2O_3$ is parallel to the (001) plane of Mo.

In accordance with present invention, FIGURE 1, shows a composite 10 comprising a substrate 12 of single crystal, electrically insulating, metal oxide on upper surface 13 of which there is provided epitaxial layer 14 of single crystal molybdenum. Molybdenum has a body centered cubic crystalline structure with a lattice parameter $a_0$=3.1401 A. Substrate 12 may comprise one of the single crystal materials listed in Table I below.

TABLE I

| Material | Crystal structure | Lattice parameters (A.) |
|---|---|---|
| Sapphire ($\alpha Al_2O_3$) | Rhombohedral (referred to hex. Axes) | $a_0$=4.75<br>$c_0$=12.95 |
| Magnesium oxide (MgO) | Cubic | $a_0$=4.203 |
| Magnesium aluminate spinel ($MgAl_2O_4$). | do | $a_0$=8.090 |
| Beryllium oxide (BeO) | Hexagonal | $a_0$=2.70<br>$c_0$=4.39 |

Preparation of inventive composite 10 (see FIGURE 1) may be accomplished by the hydrogen reduction of molybdenum hexafluoride ($MoF_6$) is a flowing system of hydrogen at atmospheric pressure. More specifically, a substrate 12 of one of the materials listed in Table 1 is prepared with surface 13 parallel to a crystallographic plane of the substrate on which molybdenum may be epitaxially deposited. (The applicable crystallographic planes are set forth more fully hereinbelow.) Surface 13 of substrate 12 then is carefully cleaned and polished using conventional techniques an dplaced on a carbon susceptor support within a standard, RF heated, vapor deposition chamber. Substrate 12 is heated to a deposition temperature of between 650° C. and 900° C., for example, by RF induction heating of the supporting susceptor.

Next, hydrogen purified by passage through a heated palladium thimble is mixed with the vapor of liquid $MoF_6$ maintained in a steel bottle at room temperature. As the mixture of molybdenum hexafluoride and hydrogen flows over heated substrate 12, molybdenum epitaxially deposits atop surface 13 to form epitaxial molybdenum layer 14. By controlling the molybdenum hexafluoride concentration and the deposition duration, films of various thickness may be produced. Typically, single crystal films ranging from less than 300 A. to several thousand Angstroms in thickness have been produced in this manner.

Verification of epitaxy and of the fact that molybdenum film 14 is in fact single crystal and has been obtained by Laue X-ray back reflection photographs of composite 10. In all cases, reflections from both molybdenum film 14 and from substrate 12 registered on the X-ray film. A first indication of epitaxy was the absence of Debye-Sherrer rings after sufficient X-ray film exposure, typically one hour, with unfiltered copper X-radiation. In addition, the orientation of molybdenum film 14 was determined using the three-circle goniometer technique. Using these techniques, the orientations and mismatch relationships listed in Table II between molybdenum film 14 and single crystal oxide substrate 12 were obtained.

Figure 2:
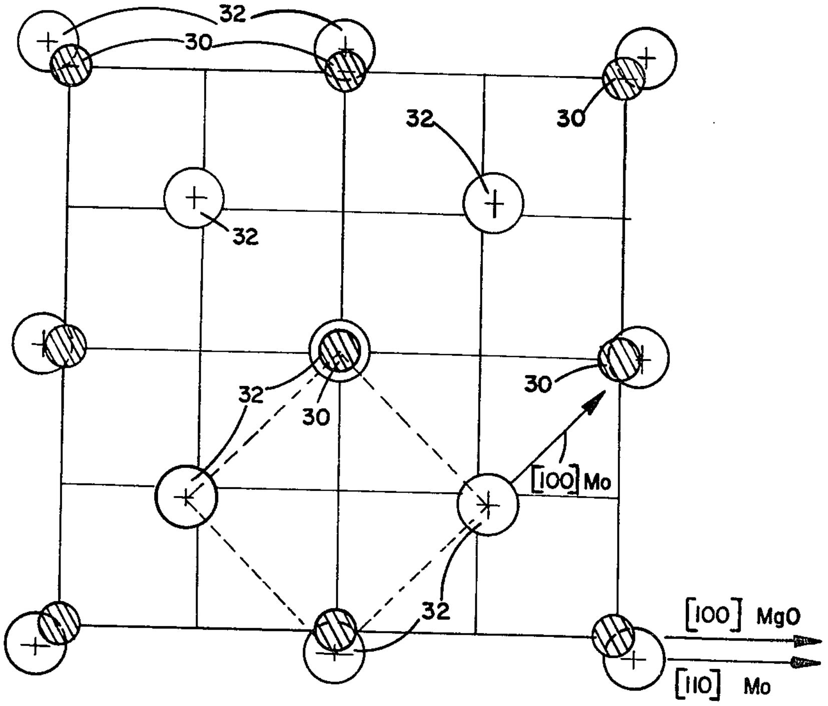
FIGURE 2 is a symbolic overlay diagram showing possible relative orientations at the interface between a MgO substrate and an epitaxial layer of Mo. As shown, the (001) crystallographic plane of the MgO is parallel to the (001) plane of Mo.

As an example illustrating the orientations and mismatch relationships set forth in Table II above, see the typical lattice overlay diagrams of FIGURES 2 and 3.

Referring now to FIGURE 2, there is shown a lattice overlay diagram illustrating interface 13 between the (001) crystallographic plane of MgO substrate 12 and the (001) crystallographic plane of Mo film 14. As indicated in FIGURE 2, the molybdenum ions are designated 32, while the Mg ions of MgO substrate 12 are designated 30. In the orientation shown, the [100] crystallographic direction of MgO is parallel to the [110] crystallographic direction of Mo.

Note in FIGURE 2, that along the [110] Mo direction each Mo ion 32 approximately concides in location to an Mg ion 30. That is, for an Mo-Mo metal ion separation of 1:1, the percentage mismatch in the [110] Mo direction is about +5.7 (This mismatch is included in the data of Table II hereinabove.) Between [110] Mo rows, as indicated at the bottom, center, and top rows of FIGURE 2, each Mo ion 32 also approximately coincides with an Mg ion 30. That is, for an Mo-Mo ion separation of 1:1 between the [110] Mo rows, the percentage mismatch (for the relative Mo and MgO orientations shown in FIGURE 2) also is +5.7. (This value also is tabulated in Table II.)

Referring now to FIGURE 3, there is shown a lattice diagram of the (001) plane of molybdenum overlaid on a diagram of the $(1\bar{1}02)$ crystallographic plane of sapphire. The various Mo and $Al_2O_3$ directions are indicated in the FIGURE 3. The overlay of FIGURE 3 was prepared from data indicated in a stereographic projection obtained from three-circle goniometer studies; as may be seen from FIGURE 3, the overlay indicates positions of highest site coincidence.

Still referring to FIGURE 3, substrate 12 of sapphire ($Al_2O_3$) has its deposition surface 13 parallel to the $(1\bar{1}02)$ plane. The film of molybdenum has its (001) crystallographic plane parallel to the sapphire plane. Note that for the configuration illustrated, the percentage mismatch along the [110] row of molybdenum is about −13.3 percent. (These data also are included in Table II above.)

With respect to the use of beryllium oxide as substrate 12, epitaxy was obtained (as indicated in Table II) with the (110) crystallographic plane of molybdenum parallel to the $(10\bar{1}1)$ plane of the BeO. In the BeO lattice there exist two equivalent positions for the deposit Mo nuclei to occupy. The two positions coincide with the permitted twins in the body centered cubic structure. As a result, (110) single crystal molybdenum can be deposited $(10\bar{1}1)$ BeO in either of two directions. In the first case, the [110] direction of the molybdenum is about 70.5 degrees from the $[1\bar{2}10]$ direction of the BeO, in the other orientation these directions are separated by about 109.5 degrees. A dual grown of Mo in these two directions is not uncommon, and may be considered a reflection across a {211} type plane in the beryllium oxide.

A similar effect occurs when molybdenum is deposited on magnesium aluminate spinel. Three equivalent orienta- TABLE II.—ORIENTATION AND MISMATCH RELATIONSHIPS BETWEEN MOLYBDENUM AND SINGLE CRYSTAL OXIDES

| Parallel Planes | Parallel direction | Along [110] Rows: (Mo-Mo): Metal ion separation | Along [110] Rows: Percentage mismatch | Between [110] Rows: (Mo-Mo): Metal ion separation | Between [110] Rows: Percentage mismatch |
|---|---|---|---|---|---|
| (100) Mo ‖ $(1\bar{1}02)$ $Al_2O_3$ | $[1\bar{1}0]$ ‖ $[11\bar{2}0]$ | 1:1 | −6.5 | 1:1 | −13.3 |
| (111) Mo ‖ (0001) $Al_2O_3$ | $[1\bar{1}0]$ ‖ $[11\bar{2}0]$ | 1:1 | −6.5 | 1:1 | −6.5 |
| (221) Mo ‖ $(10\bar{1}2)$ $Al_2O_3$ | $[1\bar{1}0]$ ‖ $[11\bar{2}0]$ | 1:1 | −6.5 | 1:3 | −11.3 |
| (110) Mo ‖ $(10\bar{1}1)$ BeO | $[1\bar{1}1]$ ‖ $[11\bar{2}0]$ | 2:1 | +6.2 | 2:1 | 0.0 |
| (211) Mo ‖ $(10\bar{1}0)$ BeO | $[1\bar{1}1]$ ‖ $[11\bar{2}0]$ | 1:1 | +1.4 | 1:2 | +0.6 |
| (001) Mo ‖ (001) MgO | [100] ‖ [110] | 1:1 | +5.7 | 1:1 | +5.7 |
| (211) Mo ‖ (110) MgO | $[1\bar{1}0]$ ‖ [001] | 1:1 | +5.7 | 3:4 | −1.9 |
| (110) Mo ‖ (111) $MgAl_2O_4$ | [001] ‖ $[1\bar{1}0]$ | 2:1 | −9.8 | 2:1 | +11.3 |

tions 60° from one another around the [110] direction are available for epitaxy with the (110) crystallographic plane of Mo parallel to the (111) plane of $MgAl_2O_4$. X-ray intensity data indicate that all three orientations occur with equal concentration. Since no simple twin relationships exist, the boundaries may be noncoherent. Even with such triple orientation, the Mo stacking in the [110] direction (normal to surface 13) may be considered perfect.

What I claim is:

1. A composite, comprising:
an electrically insulating metal oxide substrate material of monocrystalline cubic structure; and
a film of monocrystalline molybdenum epitaxially disposed on the substrate.

2. A composite, comprising:
an electrically insulating metal oxide substrate material of monocrystalline hexagonal structure; and
a film of monocrystalline molybdenum epitaxially disposed on the substrate.

3. A composite, comprising:
an electrically insulating metal oxide substrate material of monocrystalline rhombohedral structure; and
a film of monocrystalline molybdenum epitaxially disposed on the substrate.

4. A composite, comprising:
a substrate of monocrystalline sapphire; and
a film of monocrystalline molybdenum epitaxially disposed on said substrate.

5. A composite, comprising:
a substrate of monocrystalline beryllium oxide; and
a film of monocrystalline molybdenum epitaxially disposed on said substrate.

6. A composite, comprising:
a substrate of monocrystalline magnesium oxide; and a film of monocrystalline molybdenum epitaxially disposed on said substrate.

7. A composite, comprising:
a substrate of monocrystalline magnesium aluminate spinel; and
a film of monocrystalline molybdenum epitaxially disposed on said substrate.

8. A method for producing a heteroepitaxial composite comprising a substrate of single crystal electrically insulating metal oxide selected from the group consisting of sapphire, beryllium oxide, magnesium oxide or magnesium aluminate spinel, and a single crystal film of molybdenum epitaxially disposed on said substrate, comprising the steps of:
heating said substrate to between 650° C. and 900° C.; and
flowing a gaseous mixture of molybdenum hexafluoride and hydrogen over said heated substrate.

References Cited

UNITED STATES PATENTS

| | | | |
|---|---|---|---|
| 3,114,652 | 12/1963 | Schetky ---------- | 117—107.2 X |
| 3,417,301 | 12/1968 | Galli et al. ---------- | 317—237 |

OTHER REFERENCES

Miller et al., Journal of Applied Physics, 1966, vol. 37, pp. 2921 and 2922.

Powell et al., Vapor Deposition, May 10, 1966, pp. 302 to 304 relied upon.

ANDREW G. GOLIAN, Primary Examiner

U.S. Cl. X.R.

117—107.2, 160; 148—16